United States Patent [19]
Ferraiolo et al.

[11] Patent Number: 5,825,226
[45] Date of Patent: Oct. 20, 1998

[54] DELAY EQUALIZATION APPARATUS AND METHOD

[75] Inventors: Frank D. Ferraiolo, Essex Junction; John E. Gersbach, Burlington; Ilya I. Novof, Essex Junction, all of Vt.

[73] Assignee: International Business Machines Corporation, Armonk, N.Y.

[21] Appl. No.: 529,850

[22] Filed: Sep. 18, 1995

[51] Int. Cl.⁶ ............................... H03K 5/13; H03K 5/00
[52] U.S. Cl. ..................... 327/250; 327/157; 327/158; 327/148; 327/149; 327/244; 331/1 A
[58] Field of Search ................... 327/144, 147, 327/148, 149, 150, 153, 155, 156, 157, 158, 159, 160, 231, 244, 271, 274, 250, 270, 269, 199; 331/DIG. 2, 25, 1 A

[56] References Cited

U.S. PATENT DOCUMENTS

| | | | |
|---|---|---|---|
| 4,338,569 | 7/1982 | Petrich | 328/155 |
| 4,495,468 | 1/1985 | Richards et al. | 328/155 |
| 4,922,141 | 5/1990 | Lofgren et al. | 307/595 |
| 5,043,596 | 8/1991 | Masuda et al. | 307/262 |
| 5,087,829 | 2/1992 | Ishibashi et al. | 307/269 |
| 5,101,117 | 3/1992 | Johnson et al. | 327/250 |
| 5,121,086 | 6/1992 | Srivastav | 331/11 |
| 5,164,677 | 11/1992 | Hawkins et al. | 328/55 |
| 5,184,091 | 2/1993 | Srivastav | 331/10 |
| 5,216,302 | 6/1993 | Tanizawa | 327/152 |
| 5,221,863 | 6/1993 | Motegi | 307/269 |
| 5,355,037 | 10/1994 | Andresen et al. | 307/602 |

*Primary Examiner*—Timothy P. Callahan
*Assistant Examiner*—Dinh T. Le
*Attorney, Agent, or Firm*—Schmeiser, Olsen & Watts; Robert Walsh, Esq.

[57] ABSTRACT

A delay equalization circuit for minimizing the static phase error in a PLL is provided. The delay equalization circuit includes an external clock signal variable delay path, and an element for creating a pulse with a width proportional to the delay of the external clock signal variable delay path. The delay equalization circuit also includes a delay path in the feedback loop, and second element for creating a second pulse in proportion to the delay of the internal delay path. Finally, the circuit contains a comparison device. The comparison device compares the first and second pulses. The comparison device outputs a difference signal in proportion to the difference in the external and internal path delays. That difference signal is fed back and used to control the external path delay such that the external delay is driven to be substantially equal to the internal delay, minimizing the static phase error of the PLL device.

16 Claims, 4 Drawing Sheets

DELAY EQUALIZATION APPARATUS AND METHOD

BACKGROUND OF THE INVENTION

1. Technical Field

This invention relates generally to digital clock circuits, and more specifically relates to the phase alignments of digital clock signals.

2. Background Art

In digital computing clock signals serve many important timing functions. The clock signal is distributed across a distribution network to coordinate the timing of the various activities of the digital computing device. As the speed of modern devices increases, particularly in ASIC and microprocessor applications, the accuracy of the clock signals along the distribution network becomes more critical. One important parameter of clock accuracy is the clock phase alignment. Clock phase alignment is a measure of the timing difference between clock edges of different clock signals distributed throughout the device.

Because the phase of the clock signals cannot be aligned exactly, a certain amount of clock phase uncertainty exists throughout the clock distribution network. This clock phase uncertainty must be taken into account when designing these digital systems. Generally, the clock phase uncertainty limits the speed at which the device can operate. A reduction in this clock phase uncertainty is thus directly translated into an increase in the device operational speed.

Traditionally, phase-locked-loops (PLL) have been used to minimize phase error. However, traditional PLL designs suffer from significant static phase error. The static phase error is a constant phase difference between the input and output clock signals. The static phase error is generally caused by propagation delay mismatch in the receiver elements. The typical contribution to the PLL static phase error due to delay mismatch of the receiver elements is +/−200 ps. Thus, the static phase error due to delay mismatch is a major contributor to clock uncertainty and is a critical PLL parameter.

Various methods have been used to enhance the performance of PLL's. For example, U.S. Pat. No. 5,164,677 "Method and Apparatus for Synchronizing Signals" (issued to Hawkins et al. Nov. 17, 1992 and assigned to Digital Equipment Corp.) discloses a method of synchronizing signals by inserting a variable delay line into one of the transmission paths, and controlling the variable delay with a signal containing the phase error information. This disclosure addresses the phase locking of two clock signals (as with all typical PLL's) but does not address elimination of static phase error.

Another example, U.S. Pat. No. 5,355,037 "High Performance Digital Phase Locked Loop" (issued Oct. 11, 1994 to Anderson et al. and assigned to Texas Instruments Inc.) discloses a method of synchronizing signals by propagating one waveform through an adjustable delay path. This method again does not address the static phase error caused by receiver elements.

Turning to FIG. 1, FIG. 1 shows a typical PLL block diagram. A typical PLL includes a receiver 102, a phase detector 104, a charge pump 108, a loop filter 110, a voltage controlled oscillator (VCO) 112, an internal clock feedback loop 106, a second receiver 114 and a feedback divider 116. The PLL is typically used to multiply an external clock signal 118 into a higher speed clock signal output 120 and phase align the two signals.

The basic operation of a PLL is well known. The PLL compares the phase of external clock signal 118 with the high speed clock signal 120 of the distribution tree, and adjusts the phase of the high speed clock 120 to align with the external clock 118. In operation, external clock signal 118 is received by receiver 102. Receiver 102 serves to convert as necessary between on-chip and off-chip signal types, and as such receiver 102 can be any common type of known receiver circuit. The external clock signal is then transmitted to phase detector 104. Thus, receiver 102 constitutes the external clock path to phase detector 104. The high speed clock signal 120 is conducted to the phase detector 104 by the internal clock feed back loop 106 through receiver 114. In this application the internal clock signal is the high speed clock signal 120.

Phase detector 104 compares external clock signal 118 from the receiver 102 with the high speed clock signal 120 fed through receiver 114. To facilitate this comparison, a feedback divider 116 is also connected to phase detector 104 and the internal clock feed back loop 106. Feedback divider 116 produces a pulse used to gate the high speed clock signal through receiver 114. Feedback divider 116 tells phase detector 104 which high speed clock 120 pulse to phase align to external clock signal 118.

Depending upon the phase difference between the external and internal clock, phase detector 104 drives charge pump 108. The output of charge pump 108 is then filtered by loop filter 110, and finally drives VCO 112. VCO 112 provides a clock signal with a frequency in proportion to the input signal. Thus, a phase difference detected at phase detector 104 causes VCO 112 to adjust the phase by adjusting the frequency until the phase difference is eliminated.

Unfortunately, the accuracy of the phase alignment achieved by the PLL is limited. Because phase detector 104 compares the phase of external clock signal 118 to high speed clock signal 120 only after it has been delayed through receiver 102, the PLL cannot compensate for the phase error caused by receiver 102.

To minimize the phase error due to the presence of receiver 102, a second receiver, receiver 114, is added to the internal clock path feedback loop to match the delay associated with receiver 102. Unfortunately, it is extremely difficult to exactly match receiver 102 and receiver 114 such that their respective delays are identical. Without an exact match in delay there still exists a significant static phase error.

There are many different reasons why it is difficult to match the delays of receivers 102 and 114. Receivers 102 and 114 could have different slew rates at their inputs. Thus, the external clock rise and fall times would not be identical to the internal clock rise and fall time. Because circuit propagation delay depends on the input signal rise and fall time, different slew rates make it impossible to match receiver 102 and receiver 114 delays. Another reason that receivers 102 and 114 could have delay mismatch is due to on-chip circuit tracking deviations. Another reason commonly found in PLL devices is that the driver of external clock signal 118 could be a TTL driver and receiver 102 could have a CMOS compatible input, while the driver of high speed clock 120 is a CMOS output circuit matched to the CMOS input circuit of receiver 114, resulting in different delays between receiver 102 and receiver 114.

For all these reasons, propagation delay mismatch, and hence static phase error, exists in PLL devices, this static phase error being a limiting factor in the accuracy the devices can achieve. Therefore, there exists a need to provide a method to minimize the PLL static phase error due to propagation delay mismatch.

DISCLOSURE OF INVENTION

According to the present invention, a delay equalization circuit for minimizing the static phase error in a PLL is provided. The delay equalization circuit includes an external clock signal variable delay path, and an element for creating a pulse with a width proportional to the delay of the external clock signal variable delay path. The delay equalization circuit also includes an internal delay path, and a second element for creating a second pulse in proportion to delay of the internal delay path. Finally, the delay equalization circuit contains a comparison device. The comparison device compares the first and second pulses. The comparison device outputs a difference signal in proportion to the difference in the external and internal delay paths' delay. That difference signal is fed back and used to control the external variable delay path such that the delay is driven to be substantially equal, minimizing the static phase error of the PLL device.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

Figure 1:
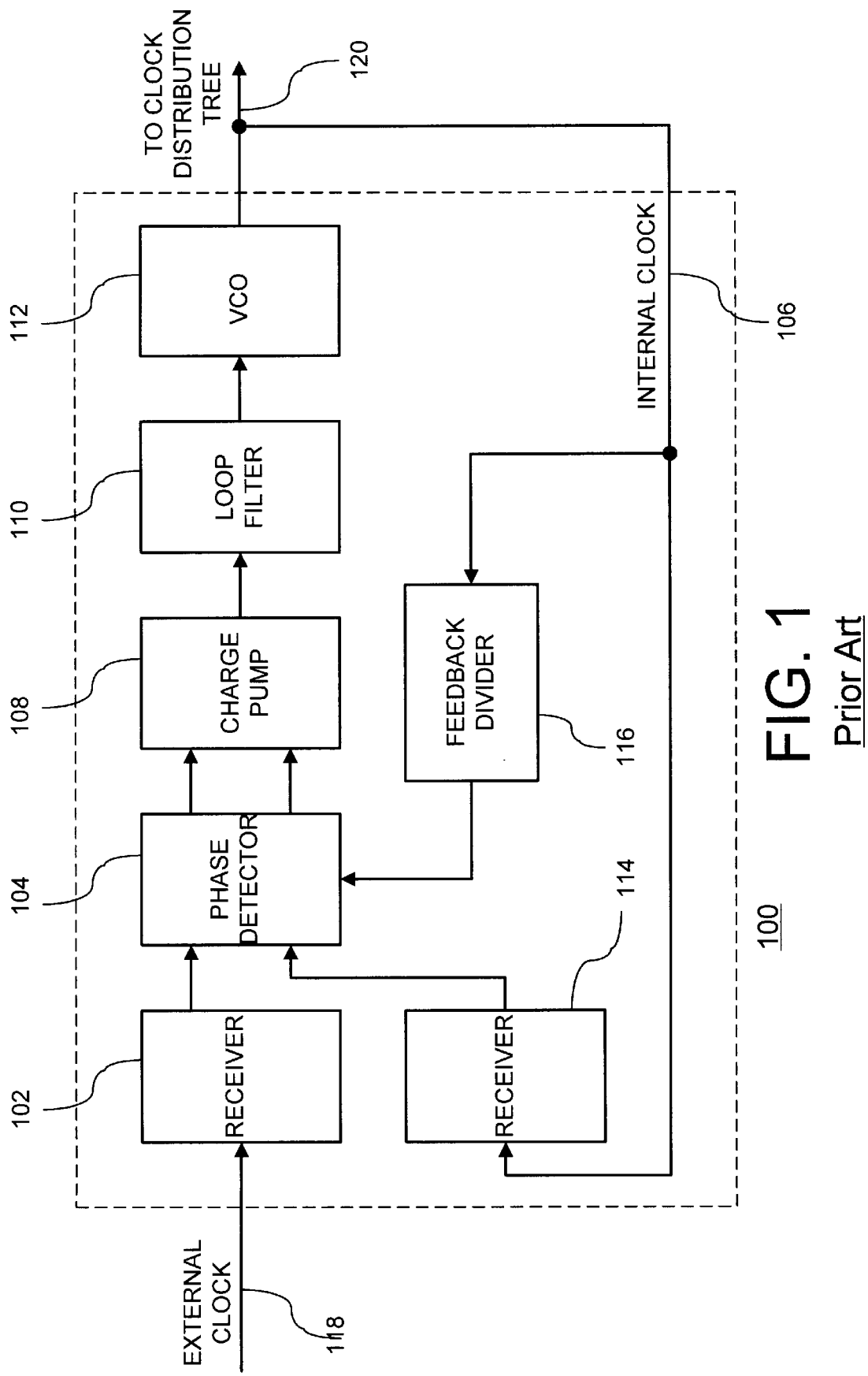
FIG. 1 is a schematic view of a traditional phase locked loop.

One application in which PLL's are used is to phase align different clock signals. In many cases, the PLL's are used to generate a high speed clock output from a low speed clock input, and phase align the high speed clock output to the low speed clock input. This application of a PLL is shown in FIG. 1. The PLL is used to phase align the high speed clock signal on the clock distribution tree with the external clock. The clock distribution tree represents the network on which the clock signal is distributed across the system, be it a device, printed circuit board, collection of printed circuit boards, etc. Unfortunately, the PLL is limited in its ability to align the phase of the clocks by the static phase error, caused in part by delay differences between receiver 102 and receiver 114.

Figure 2:
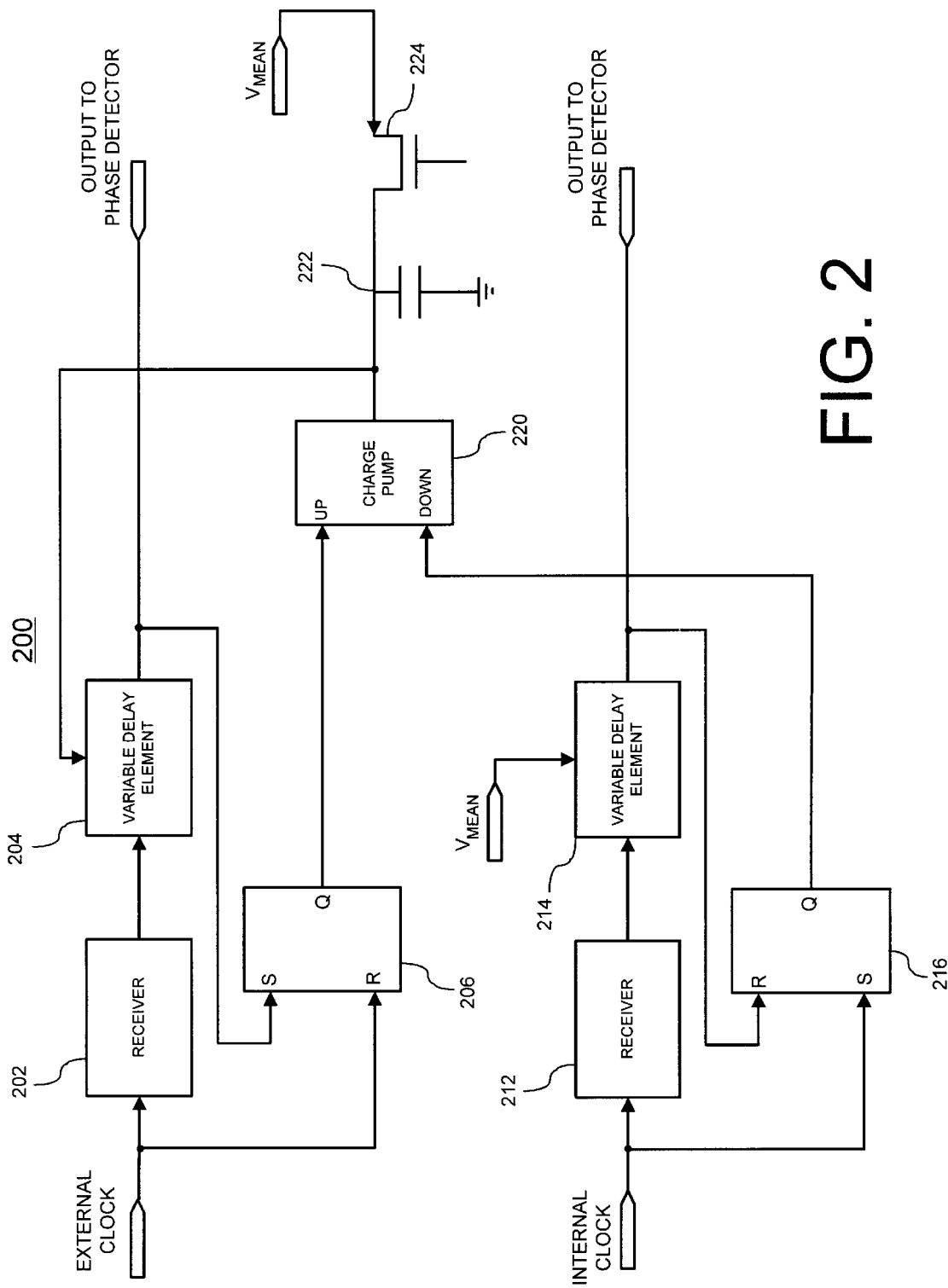
FIG. 2 is a schematic view of a delay equalization circuit in accordance with the present invention.

Turning now to FIG. 2, FIG. 2 is a schematic view of a delay equalization circuit 200. The delay equalization circuit 200 can be used in a clocking application such as a PLL, to minimize static phase error. For example, the delay equalization circuit 200 could be used to replace receivers 102 and 114 of FIG. 1 to minimize the static phase error of that PLL device.

The delay equalization circuit 200 includes a receiver element 202, a first variable delay element 204, a first latch 206, a second receiver element 212, a second variable delay element 214, a second latch 216, a charge pump 220, a filter 222 and a switch 224. The receiver element 202 receives the external clock signal 118. The receiver element 202 serves the same purpose as receiver element 102 of FIG. 1. For example, the receiver element 202 may serve to drive an off-chip signal (e.g., external clock 118) to the rest of the circuit 200.

The output of receiver 202 is connected to a variable delay element 204. The variable delay element 204 provides a variable delay in proportion to a control signal. The variable delay element 204 is designed to provide sufficient variation to compensate for anticipated delay mismatches, typically on the order of 500 ps. The variable delay element 204 is described in greater detail in relation to FIG. 3.

For the specific circuit of FIG. 2, the output of variable delay element 204 is tied to the input of phase detector 104 of FIG. 1. Thus, the receiver 202 and the variable delay element 204 now comprise the external clock path to the phase detector 104. The variable delay element 204 allows the delay along the external clock path to be adjusted.

The output of the variable delay element 204 is also connected to the set input of latch 206. Latch 206 serves as a delay signal creation means, creating a pulse proportional to the path delay. Set/reset latches are used where delay equalization is to be maintained for the clock rising edge. The external clock signal is also connected directly through an undelayed path to the reset input of latch 206. This results in the latch 206 generating a inverted clock pulse at output Q with a width equal to the delay time from the external clock input to the phase detector. Effectively, the latch 206 serves to measure the delay of the external clock path.

The delay equalization circuit 200 also includes a receiver element 212. The receiver element 212 receives the internal clock signal along the feedback loop 106 of FIG. 1. In this application the internal clock signal includes a high speed clock to be phase aligned to the external clock signal. The receiver element 212 serves the same purpose as receiver element 114 of FIG. 1. Namely, the receiver element 212 serves as a static delay for internal clock signal to approximate the static delay of the external clock signal caused by receiver element 202.

The output of receiver 212 is connected to a variable delay element 214. The variable delay element 214 is similar to variable delay element 204 and thus is described in greater detail in relation to FIG. 3. The variable delay element 214 provides a variable delay in proportion to the voltage at the control signal input. Typically, the voltage at the control input of variable delay element 214's is set at voltage $V_{MEAN}$. $V_{MEAN}$ is suitably selected to set variable delay element 214 to the approximate midpoint between its maximum and minimum delay. Because variable delay element 204 and variable delay element 214 are substantially identical, setting variable delay element 214's delay at its midpoint provides the greatest probability of variable delay element 204 being able to compensate for any static phase error. Accordingly, the variable delay element 214 could be replaced with a fixed delay having an appropriate delay, such as a delay approximately equal to the midpoint between the maximum and minimum delay that can be produced by variable delay element 204.

The output of variable delay element 214 is tied to phase detector 104 of FIG. 1. Thus, receiver 212 and variable delay element 214 comprise the internal clock path to the phase detector 104 of FIG. 1. The variable delay element 214 allows the delay along the internal clock path to be adjusted in the same manner that the external clock path is adjusted by variable delay element 204.

The output of variable delay element 214 is also connected to the reset input of latch 216. The internal clock signal is connected directly to the set input of latch 216. This results in the latch 216 generating a delay signal pulse at output Q with a width equal to the delay time from the internal clock input to the phase detector. Effectively, latch 216 serves to measure the delay of the internal clock path.

The outputs of both latches 206 and 216 are connected to a charge pump circuit 220. Charge pump 220 has inputs UP and DOWN which control the output. When the negative pulse width of the UP signal is equal to the positive pulse width of the DOWN signal the output of charge pump 220 remains constant. When the pulse width of the UP signal exceeds the pulse width of the DOWN signal, charge is added to the output of charge pump 220. When the pulse width of the DOWN signal exceeds the pulse width of the UP signal, charge is removed from the output of charge pump 220.

For the circuit of FIG. 2, the output of latch 206 is connected to the UP input of charge pump 220. Latch 206 provides an inverted clock pulse to the UP input equal to the external clock delay. Likewise, the output of latch 216 is connected to the DOWN input of charge pump 220. Latch 216 provides a clock pulse to the DOWN input equal to the internal clock delay. The charge pump 220 output is connected to a filter 222, filter 222 suitably comprising a single integrated FET capacitor. The output of charge pump 220 is also connected to and used to control the variable delay element 204. When the external and internal clock path delays are equal, the width of the pulses from latch 206 and 216 inputted to the UP and DOWN inputs of the charge pump 220 are equal, and no net charge is added to the filter 222. With no net charge added, the voltage at the filter 222 remains constant and the delay of variable delay element 204 is unchanged.

When the external clock delay is larger than the internal one, the pulse width generated by latch 206 is larger that the pulse width generated by latch 216. Therefore, a net charge is added by charge pump 220 to the filter 222 increasing the voltage on the filter 222. The increase in voltage will cause the variable delay element 204 to shorten its delay, thereby decreasing the external clock delay.

When the external clock delay is smaller than the internal one, the pulse width generated by latch 206 is smaller than the pulse width generated by latch 216. Therefore, net charge is removed by the charge pump 220 from the filter 222, decreasing the voltage on the filter 222. The decrease in voltage will cause the variable delay element 204 to increase its delay, thereby increasing the external clock delay.

Accordingly, the output of the charge pump serves to control variable delay element 204, adjusting the external clock path delay to equal the internal clock path delay. Because the clock path delays are equal, the static phase error due to delay mismatch in the receiver elements is effectively minimized.

The filter 222 is also connected to a switch 224. The switch 224 typically is an N-FET device characteristically having a small voltage drop across it when turned on or activated and essentially being an open circuit when inactive. In this application, the switch is activated when PLL phase locks, which occurs when the PLL phase aligns within a predetermined tolerance. When the PLL phase locks, the phase detector provides a PLL lock signal. That signal is used to control switch 224. In operation, the switch 224 is turned on until the PLL locks, and the voltage at filter 222 is driven to $V_{MEAN}$. With $V_{MEAN}$ at the control input of variable delay element 204 the delay of that element is set at approximately the midpoint between its maximum and minimum delay. When the PLL has locked, the switch is turned off and the voltage at filter 222 is determined by the output of charge pump 220, and the delay equalization circuit 200 will adjust the delay of variable delay element 204 to reduce the static phase error.

Figure 3:
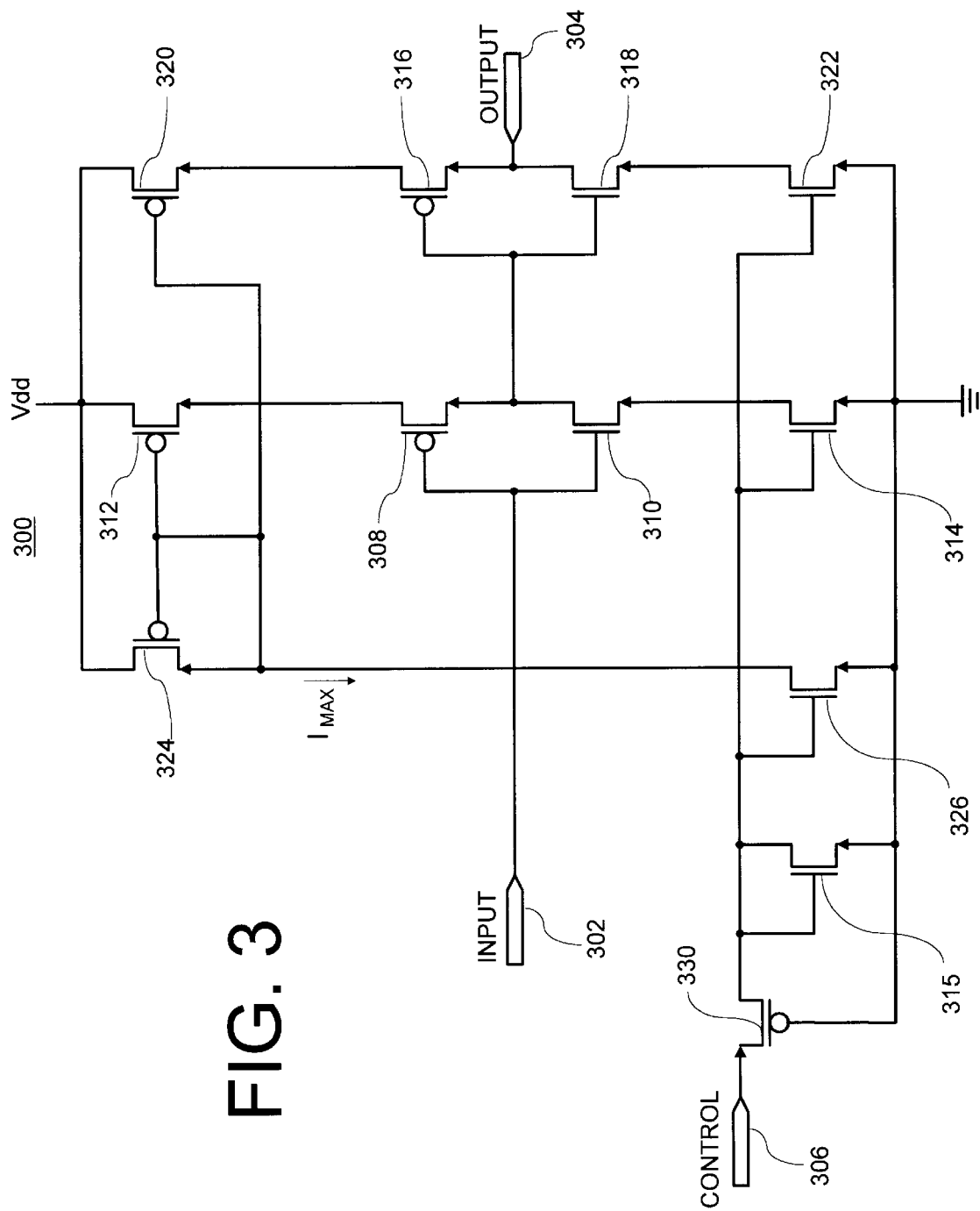
FIG. 3 is a schematic view of a variable delay circuit such as those used in delay equalization circuit of FIG. 2.

Turning now to FIG. 3, FIG. 3 is a schematic view of a variable delay circuit 300. The variable delay circuit 300 corresponds to one specific implementation for the variable delay elements 204 and 214 of FIG. 2. The variable delay circuit 300 has a signal input 302, a signal output 304 and a control input 306. As long as the voltage at control 306 is within the variable delay circuit's operating range, the voltage at the control input 306 determines the delay from signal input 302 to signal output 304.

The variable delay circuit operates as follows. The voltage at the control input 306 controls the level of current, $I_{MAX}$, that flows through N-FET 315, P-FET 324 and N-FET-326. As the control voltage increases or decreases, $I_{MAX}$ increases or decreases respectively. P-FET 312 and P-FET 320 mirror P-FET 324, and thus the current through P-FET 320 and 312 follows and cannot exceed the current on P-FET 324 ($I_{MAX}$). Likewise, N-FET 314 and N-FET 322 mirror N-FET 326 and thus follow and are limited to sinking $I_{MAX}$ current.

The variable delay circuit 300 comprises two identical variable inverter stages. The first inverter stage comprises P-FET 308 and N-FET 310. The second inverter stage comprises P-FET 316 and N-FET 318. The clock signal travels through the two inverter stages. When the clock signal is in transition, the current through the two inverter stages is limited by $I_{MAX}$. When not in transition, the current flows through the inverter stages until the capacitance at its output is fully charged. Thus, the delay provided by each inverter stage varies according to current available to charge and discharge its output and the capacitance at its output.

In this variable delay circuit 300 the signal path from input 302 to output 304 travels through the two variable inverter stages. P-FET 308 and N-FET 310 comprise the first inverter. The first inverter delay varies as a function of current provided by current source P-FET 312 and current sink N-FET 314. The level of current provided varies according to the level of current $I_{MAX}$ and thus according to the control voltage. Therefore, when the voltage at the control input 306 increases, the current sources P-FET 312 and N-FET 314 increase their current, causing the first inverter's delay to shorten. Likewise, when the voltage at control input 306 decreases, the current that P-FET 312 and N-FET 314 provide decreases, causing the first inverter's delay to increase.

The second inverter is identical to the first and comprises P-FET 316 and N-FET 318 and its associated current sources P-FET 320 and N-FET 322. The second inverter circuit operates the same as the first, and again, the level of current provided varies according to the level of current $I_{MAX}$ and thus according to the control voltage. Therefore, when the voltage at the control input 306 increases, the current sources P-FET 320 and N-FET 322 increase their current, causing the second inverter's delay to shorten. Likewise, when the voltage at the control input 306 decreases, the current that P-FET 320 and N-FET 322 provide decreases, causing the second inverter's delay to increase.

Variable delay element 300 thus provides two inverters whose delays are determined by the voltage on control input 306. Thus, the output 304 will be the same as the signal input 302, delayed by the two inverter stages.

P-FET 330 is the control input transistor whose gate is grounded and functions as a resistor when the input voltage exceeds its threshold voltage. The input is connected to the output of the charge pump (e.g., filter capacitor 222 of FIG. 2). The value of filter capacitor (e.g., 222) is chosen to make the RC time constant formed by the capacitor and P-FET 330 long compared to the cycle time of the external clock signal of FIG. 2.

Thus configured, variable delay circuit 300 provides a variable delay between its input 302 and output 304, with the amount of delay being controlled by the voltage at control input 306.

Figure 4:
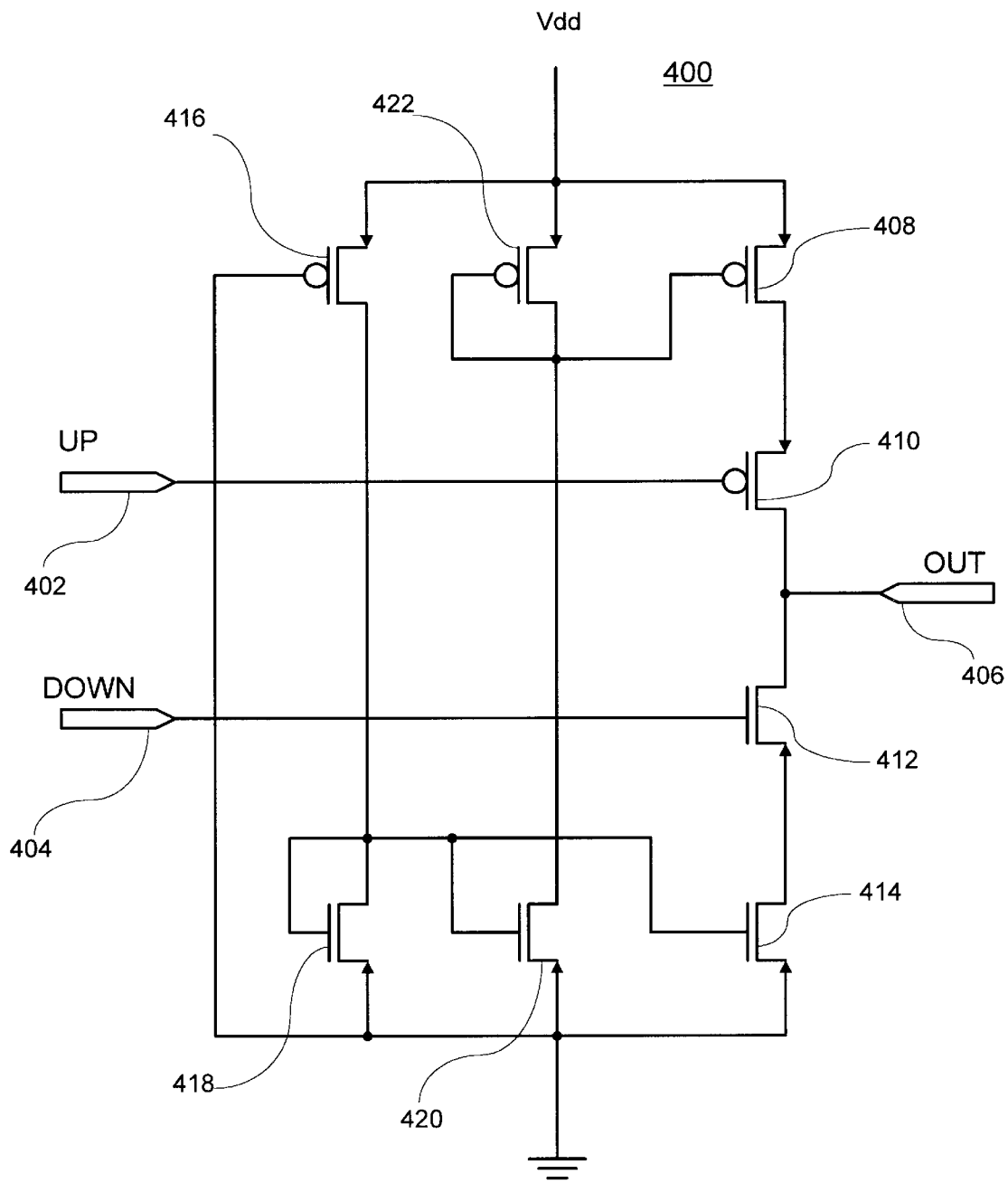
FIG. 4 is a schematic view of a charge pump circuit such as the one used in the delay equalization circuit of FIG. 2.

Turning now to FIG. 4, FIG. 4 is a schematic view of a charge pump circuit 400. The charge pump circuit 400 corresponds to the charge pump element 220 of FIG. 2. The charge pump circuit 400 has an UP input 402 and a DOWN input 404. Charge pump 400 supplies positive and negative charge to filter 222 of FIG. 2 through output 406. A positive charge is supplied to output 406 by P-FET 408 and P-FET 410 when the UP input is low. A negative charge is supplied to output 406 by N-FET 412 and N-FET 414 when the DOWN input is high.

P-FET 416 acts as a resistor and determines the current flowing into N-FET 418. N-FET 420 mirrors the current of N-FET 418 into P-FET 422 which forms a current source with P-FET 408 to supply the charge up current to filter 222 of FIG. 2, through P-FET 410 which acts as a switch controlled by the UP input 402. N-FET 414 mirrors N-FET 418 current to sink the filter 222's discharge current through N-FET 412 which acts as a switch controlled by the DOWN input 404.

Thus configured, charge pump circuit 400 provides a difference signal in the form of a current source or sink at output 406 proportional to the difference in pulse widths applied at its UP input 402 and DOWN input 404. This source and sinking of current by charge pump circuit 400 varies the voltage on filter 222. This varying voltage signal can then be used to control the variable delay element 204 of FIG. 2.

Thus, the disclosed invention minimizes the static phase error of PLL devices, including the static phase error introduced as a result of propagation delay mismatch between receivers. The invention minimizes the static phase error by introducing a variable delay circuit in the signal path, and adjusting the delay of the circuit to compensate for the receiver delay mismatch.

While the invention has been particularly shown and described with reference to a preferred exemplary embodiment thereof, it will be understood by those skilled in the art that various change in form and details may be made therein without departing from the spirit and scope of the invention. For example, either of the variable delay elements of FIG. 2 could be replaced with a fixed delay element. As mentioned above, variable delay element 214 could be replaced with a fixed delay element. In addition, while the preferred embodiment described has a charge pump 220 dynamically controlling the delay of a variable delay element in the external clock path, charge pump 220 could instead control the delay of a variable delay element in the internal clock path. Also, while the disclosed invention has been described in relation to a single PLL device, those skilled in the art will recognize that it applies the elimination of static phase error in collections of devices, printed circuit boards, or entire systems.

We claim:

1. A delay equalization circuit comprising:
a first variable delay path receives a first clock signal;
a means for creating a first signal in proportion to the delay of said first variable delay path coupled to said first clock signal and a first output of said first variable delay path;
a second delay path receives a second clock signal;
a means for creating a second signal in proportion to the delay of said second delay path coupled to said second clock signal and a second output of said second delay path;
a means for comparing said first and second signals, said comparing means receiving said first and second signals, said comparing means creating a difference signal proportional to the difference in the delays of said first variable and second delay paths, said difference signal used to control the delay of said first variable delay path; and
wherein said means for creating said first signal and said means for creating said second signal comprise set/reset latches.

2. A delay equalization circuit comprising:
a first variable delay path receives a first clock signal;
a means for creating a first signal in proportion to the delay of said first variable delay path coupled to said first clock signal and a first output of said first variable delay path;
a second delay path receives a second clock signal;
a means for creating a second signal in proportion to the delay of said second delay path coupled to said second clock signal and a second output of said second delay path; and
a means for comparing said first and second signals, said comparison means receiving said first and second signals, said comparing means creating a difference signal proportional to the difference in the delays of said first variable and second delay paths, said difference signal used to control the delay of said first variable delay path, wherein said comparison means comprises a charge pump element.

3. A delay equalization circuit comprising:
a first variable delay path receives a first clock signal;
a means for creating a first signal in proportion to the delay of said first variable delay path coupled to said first clock signal and a first output of said first variable delay path;
a second delay path receives a second clock signal;
a means for creating a second signal in proportion to the delay of said second delay path coupled to said second delay path;
a means for comparing said first and second signals, said comparison means receiving said first and second signals, said comparing means creating a difference signal proportional to the difference in the delays of said first variable and second delay paths, said difference signal used to control the delay of said first variable delay path; and
a switch, said switch connected to said comparison means and activating said comparison means.

4. A delay equalization circuit comprising:
a first variable delay path receives a first clock signal;
a means for creating a first signal in proportion to the delay of said first variable delay path coupled to said first clock signal and a first output of said first variable delay path;

a second delay path receives a second clock signal;

a means for creating a second signal in proportion to the delay of said second delay path coupled to said second delay path;

a means for comparing said first and second signals, said comparison means receiving said first and second signals, said comparing means creating a difference signal proportional to the difference in the delays of said first variable and second delay paths, said difference signal used to control the delay of said first variable delay path; and wherein said first variable delay path comprises a first variable delay element and said second delay path comprises a second variable delay element, wherein said second variable delay element is set at a predetermined delay.

5. A delay equalization circuit comprising:

a first variable delay path receives a first clock signal;

a means for creating a first signal in proportion to the delay of said first variable delay path coupled to said first clock signal and a first output of said first variable delay path;

a second delay path receives a second clock signal;

a means for creating a second signal in proportion to the delay of said second delay path coupled to said second delay path;

a means for comparing said first and second signals, said comparison means receiving said first and second signals, said comparing means creating a difference signal proportional to the difference in the delays of said first variable and second delay paths, said difference signal used to control the delay of said first variable delay path; and wherein said first variable delay path comprises a first receiver element and a first variable delay element, and wherein said second delay path comprises a second receiver element and a second variable delay element, wherein the second variable delay element is set at a predetermined delay.

6. A phase-locked loop, wherein said phase-locked loop includes a phase detector, a charge pump and an oscillator, wherein said oscillator generates an output signal with a frequency proportional to output of said charge pump, the phase-locked loop further comprising:

first delay signal creation means having a first input coupled to a first clock signal, and having a second input coupled through a first variable delay path to said first clock signal, said first delay signal creation means creating a first delay signal in proportion to the delay of said first variable delay path;

second delay signal creation means having a first input coupled to a second clock signal, and having a second input coupled through a second delay path to said second clock signal, said second delay signal creation means creating a second delay signal in proportion to the delay of said second delay path; and means coupled to the first delay signal creation means and the second delay signal creation means for comparing said first and second delay signals, said comparing means creating a difference signal proportional to the difference in the delays of said first variable and second delay paths, said difference signal used to control the delay of said first variable delay path.

7. The phase-locked loop of claim 6 wherein said phase detector compares the output of said first variable delay path to the output of said second delay path, said phase detector having an output proportional to the phase difference of signals on said first and second variable delay path, and having a lock output signal which goes active when said phase-locked loop has achieved frequency and edge alignment of the first and second clock signals within predetermined tolerances.

8. The phase-locked loop of claim 6 wherein said first delay signal creation means and said second delay signal creation means comprise set/reset latches.

9. The phase-locked loop of claim 6 wherein said comparison means comprises a charge pump element.

10. The phase-locked loop of claim 6 wherein said first variable delay path comprises a variable delay element and said second delay path comprises a second variable delay element, wherein said second variable delay element is set at a predetermined delay.

11. The phase-locked loop of claim 10 where said predetermined delay is such that said second variable delay element is set at a delay approximately the midpoint between said second variable delay element's maximum and minimum delay.

12. The phase-locked loop of claim 7 wherein said first variable delay path comprises a first receiver element and a first variable delay element, and wherein said second variable delay path comprises a second receiver element and a second variable delay element, wherein the second variable delay element is set at a predetermined delay.

13. The phase-locked loop of claim 12 further comprising a switch, wherein said switch serves to set the delay of said first variable delay element at a predetermined delay until said lock output signal of said phase detector is active.

14. A method for minimizing the static phase error of a phase-locked-loop, the method comprising the steps of:

a) receiving a first signal into a first variable delay path and measuring the delay of said first variable delay path for generating a third signal;

b) receiving a second signal into a second delay path and measuring the delay of said second delay path for generating a fourth signal;

c) comparing said third signal and said fourth signal for generating a difference signal;

d) adjusting said delay of first variable delay path using said difference signal to make first variable delay path substantially equal to the delay of said second delay path; and e) driving said first and second signals delayed through said respective first variable and second delay path to a phase detector.

15. The method of claim 14 wherein said step of receiving a first signal comprises the step of providing an external clock signal and wherein said step of receiving a second signal comprises the step of feeding back a high speed clock signal from an output of the phase-locked loop.

16. The method of claim 14 wherein said step of adjusting the delay of said first variable delay path is performed after said phase-locked-loop has locked.

* * * * *